US006742150B1

(12) United States Patent
Ghameshlu et al.

(10) Patent No.: US 6,742,150 B1
(45) Date of Patent: May 25, 2004

(54) LOW REDESIGN APPLICATION-SPECIFIC MODULE

(75) Inventors: Majid Ghameshlu, Wien (AT); Karlheinz Krause, Planegg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/806,105

(22) PCT Filed: Sep. 1, 1999

(86) PCT No.: PCT/DE99/02733

§ 371 (c)(1), (2), (4) Date: Feb. 28, 2001

(87) PCT Pub. No.: WO00/19223

PCT Pub. Date: Apr. 6, 2000

(30) Foreign Application Priority Data

Sep. 29, 1998 (DE) ........................................ 198 44 731

(51) Int. Cl.[7] ................................................ G01R 31/28
(52) U.S. Cl. ....................................................... 714/727
(58) Field of Search ................................ 714/726, 727; 326/16

(56) References Cited

U.S. PATENT DOCUMENTS 5,515,505 A 5/1996 Ishizuka ...................... 714/30
5,544,174 A 8/1996 Abend ........................ 714/726
5,805,609 A 9/1998 Mote, Jr. .................... 714/726

FOREIGN PATENT DOCUMENTS

EP 0 639 006 A1 2/1995

OTHER PUBLICATIONS

A. Auer, et al., "Schaltungstest mit Boundary Scan", Heidelberg: Huthig–Verlag, (1996) pp. 107f, 118–125, 130f.

The Institute of Electrical and Electronics Engineers: IEEE Standard Test Access Port and Boundary–Scan Architecture, IEEE Standard 1149.1–1990, New York, (1990), pp. 1–3. (one sheet–double sided).

Korus, R., et al., "Boundary–Scan: Status und neue Applikationen", In: Elektronik, (1997) vol. 23, pp. 114–122.

*Primary Examiner*—Albert Decady
*Assistant Examiner*—Shelly A Chase
(74) *Attorney, Agent, or Firm*—Morrison & Foerster LLP

(57) ABSTRACT

The present invention, in addition to the number of connections required for the specified functions of an ASIC, provides an application specific module ASIC that has additional connections as spares for subsequent modification. Buffers, boundary scan devices and, possibly, basic logic function, are reserved for the additional connections, which may be arranged in a geometrically uniform distribution and which are intended as inputs or as outputs. In the event of a redesign, in particular in the event of only minor design corrections, the effort development costs and time is considerably reduced.

6 Claims, 1 Drawing Sheet

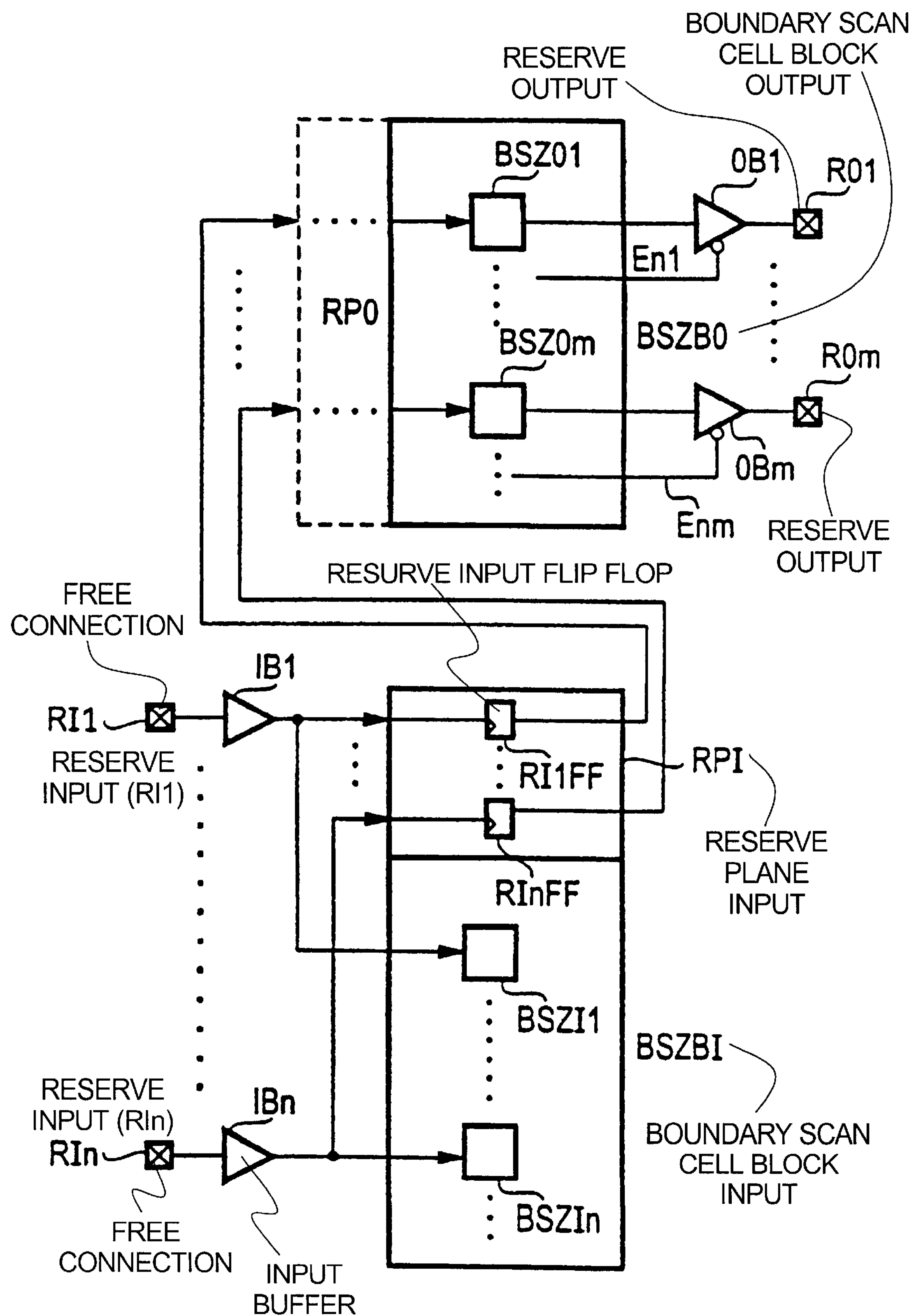
BOUNDARY SCAN CELL BLOCK OUTPUT
RESERVE OUTPUT
BSZ01
0B1
R01
RP0
En1
BSZB0
BSZ0m
R0m
0Bm
Enm
RESERVE OUTPUT
RESURVE INPUT FLIP FLOP
FREE CONNECTION
IB1
RI1
RESERVE INPUT (RI1)
RI1FF
RPI
RESERVE PLANE INPUT
RInFF
BSZI1
BSZBI
BOUNDARY SCAN CELL BLOCK INPUT
RESERVE INPUT (RIn)
IBn
RIn
BSZIn
FREE CONNECTION
INPUT BUFFER

LOW REDESIGN APPLICATION-SPECIFIC MODULE

BACKGROUND OF THE INVENTION

1. Field of the Invention

The subject matter of the application relates to a module having an integrated circuit in accordance with a customer requirement (ASIC) with devices, associated with its connections, for receiving or transmitting electrical signals, in particular boundary scan devices in accordance with IEEE Standard 1149.1a for test purposes, which is equipped with the number of connections required for the specified functions of the module.

2. Description of the Related Art

Application specific modules ASIC (application specific integrated circuits) are used to solve customer-specific circuitry problems.

Application specific modules ASIC, which have boundary scan devices in accordance with IEEE Standard 1149.1a are known in principle from Elektronik 23/1997, pages 114 to 122.

If a given application specific module ASIC is intended to be adapted to different requirements, then, conventionally, the modification process requires a complete design, layout and test phase.

SUMMARY OF THE INVENTION

The present invention is directed to reducing the effort in terms of development costs and time for modification of a customer specific module, in particular in the event of only minor design corrections.

In the case of an object as outlined by the features of the precharacterizing clause, the problem is solved by providing free connections, in addition to the number of required connections. Boundary scan devices are being allocated to these free connections.

The subject matter of the application has the following advantages:

- No changes to the boundary scan logic, wiring at the top levels insertion of input-output buffers, or simulations relating to them are required for new connections (pins), since the reserved pins can be used.
- There is no need to produce a new BSDL (boundary scan description language) file or to generate a new boundary scan test.
- No new pinning definitions with the ASIC manufacturers.
- No change to the NAND tree.
- No change relating to the clock tree or SSO (Simultaneously Switching Outputs).
- The probability of errors in the redesign is considerably reduced, since less is changed. (Less change=>fewer errors).
- The documentation relating to pins, JTAG, (for example BSDL) remains to the same standard.
- The emulation of the redesign is simplified, since no new pins occur.
- The ASIC manufacturers offer changes to a customer specific module, which changes are limited to the metallization level more cost-effectively than if new logic elements had to be incorporated and it was necessary to interfere with the overall layout; the present invention offers the capability to change the logic function by changing the internal wiring, which can be carried out cost-effectively using a change capability which is limited to the metallization level,
- The probability of being able to carry out a redesign in this cost-saving and time-saving manner is considerably increased.

BRIEF DESCRIPTION OF THE DRAWINGS

The FIGURE shows a basic illustration of one implementation of the present invention in an ASIC.

DETAILED DESCRIPTION OF THE PREFERRED EMBODIMENT

When an integrated circuit Ic, which is not shown in any more detail, is being implemented in a customer-specific module ASIC (application specific integrated circuit), a given number of connections are required to provide the specified functionalities. Connections are each allocated devices for test purposes—specifically boundary scan cells (input & output) BSZIO . . BSZIn,BSZ1O . . BSZOm—in accordance with IEEE Standard 1149.1a, which can be connected to form a boundary scan chain.

According to the application, additional free connections RII . . RIn, RO1 . . ROm (which stand for Reserve Input and Reserve Output) are reserved in addition to the number of connections required as shown in principle in the FIG. and these additional free connections are connected to further devices. The further devices relate to a boundary scan cell allocated to each connection and, possibly, to additional logic functions, such as a flipflop. The upper part of the FIG shows an embodiment for connections RO1 . . ROm (which stands for: Reserve Output) which are used as outputs and emit electrical signals, and the lower part shows an embodiment for connections RI1 . . RIn (which stands for: Reserve Input) which are used as inputs and receive electrical signals.

One input RI1 . . RIn is connected via a respective buffer circuit IB1 . . IBn (which stands for: Input Buffer) to an associated boundary scan cell BSZI1 . . BSZIn. The boundary scan cells of a number of inputs may be combined to form a block BSZBI. An area RPI (which stands for: Reserve Plane Input) is reserved on the semiconductor substrate of the integrated circuit for an input RI1 . . RIn, and a common area can be reserved for a number of inputs RI1 . . RIn. One input RI1 . . RIn may be connected to the input, which can be arranged on the reserved area, of a flipflop RI1FF . . RInFF (which stands for: Reserve Input Flipflop) which is arranged on the reserved area. The reserved area is intended for implementation of further functionalities, which are not yet known at the time of the original implementation but are required at a later time, for example if the integrated circuit is redesigned. Simple logic circuits, such as logic gates and/or flipflops for use in a subsequent redesign, may be provided at this stage on the reserved area. In the original implementation of the ASIC, the inputs RI1 . . RIn may be permanently locked at a logic level "0" or "1" in operation.

The following measures are within the scope of the present invention for those connections which are reserved as spare inputs:

- Installation of the input buffer
- Provision of BS cells and their top wiring as well as carrying out the required simulations
- Any NAND tree wiring of the inputs.

One output RO1 . . ROm is connected to the output of an associated buffer circuit OB1 . . OBm (which stands for:

Output Buffer), which has an activation connection En1 . . Enm (which stands for: Enable), with the input of the buffer circuit being connected to a boundary scan cell BSZO1 . . BSZOm. The boundary scan cells of a number of outputs may be combined to form a block BSZBO. An area RPO (which stands for: Reserve Plane Output) is reserved for an output RO1 . . ROm on the semiconductor substrate of the integrated circuit, and a common area can be reserved for a number of outputs RO1 . . ROm. The reserved area RPO is intended for an implementation of further functionalities which are not yet known at the time of the original implementation but are required at a later time, for example if the integrated circuit is redesigned. Simple logic circuits, such as logic gates and/or flipflops for use in a subsequent redesign, may be provided at this stage on the reserved area. In the original implementation of the ASIC, the outputs RO1 . . ROm may be permanently locked at a logic level "O" or "1" in operation.

One output RO1 . . . ROm may be connected to the output, which can be arranged on the reserved area, of a flipflop RI1FF . . RInFF (which stands for: Reserve-Input FlipFlop) which is arranged on the reserved area.

The following measures are within the scope of the subject matter of the application for those connections which are reserved as spare outputs:

Installation of the output buffer

Provision of the BS cells and for enable signals for the output buffer and its top wiring, as well as carrying out the necessary simulations Possibly, dead logic for later use. (FF, simplest gate).

In the present invention, unused ASIC pins (reserved pins) and flipflops (reserved FF) in the ASIC are thus implemented as silent reserves for possible redesigns. The reserved pins are distributed geometrically uniformly over the 4 sides of the ASIC. One reserved FF is in each case connected to the input or output buffer of the reserved pins.

Although other modifications and changes may be suggested by those skilled in the art, it is the intention of the inventors to embody within the patent warranted hereon all changes and modifications as reasonably and properly come within the scope of their contribution to the art.

What is claimed is:

1. A module with an Application Specific Integrated Circuit, comprising:

boundary scan devices for at least one of receiving and transmitting electrical signals, said boundary scan devices associated with an Application Specific Integrated Circuit's connections, said Application Specific Integrated Circuit being equipped with a number of connections required for specified functions of said module, said Application Specific Integrated Circuit further equipped with free connections, said free connections for allocation to the boundary scan devices.

2. A module according to claim 1, wherein said free connections are provided with logic functions.

3. A module according to claim 1, wherein a flipflop is being allocated to each of said free connections.

4. A module according to claim 1, wherein the free connections are distributed uniformly among the number of connections required for specified functions of said module.

5. A module according to claim 1, wherein free connections that are reserved for receiving signals are wired in accordance with a NAND tree principle.

6. A module according to claim 1, wherein said devices are boundary scan devices in accordance with IEEE Standard 1149.1a for test purposes.

* * * * *